United States Patent
Hennings et al.

(10) Patent No.: US 9,718,549 B2
(45) Date of Patent: Aug. 1, 2017

(54) GREY WATER INTERFACE VALVE LIQUID LEVEL SENSOR SYSTEM

(71) Applicant: MAG Aerospace Industries, LLC, Carson, CA (US)

(72) Inventors: Jakob Hennings, Hamburg (DE); Rohan Lean, Hamburg (DE); Joachim Hilse, Neumuenster (DE); Razmik B. Boodaghians, Glendale, CA (US); Jeroen Willem Kurvink, Hamburg (DE)

(73) Assignee: MAG Aerospace Industries, LLC, Carson, CA (US)

( * ) Notice: Subject to any disclaimer, the term of this patent is extended or adjusted under 35 U.S.C. 154(b) by 271 days.

(21) Appl. No.: 14/456,068

(22) Filed: Aug. 11, 2014

(65) Prior Publication Data
US 2015/0040311 A1    Feb. 12, 2015

Related U.S. Application Data

(60) Provisional application No. 61/864,143, filed on Aug. 9, 2013.

(51) Int. Cl.
*B64D 11/02* (2006.01)
*G01F 23/22* (2006.01)
(Continued)

(52) U.S. Cl.
CPC ............. *B64D 11/02* (2013.01); *E03B 1/042* (2013.01); *G01F 23/22* (2013.01); *G01F 23/263* (2013.01);
(Continued)

(58) Field of Classification Search
CPC .... G01F 23/263; G01F 23/265; G01F 23/266; G01F 23/268; G01F 25/0061; G01F 23/26; G01F 23/261; G01F 23/22; B64D 11/02; E03F 1/007; E03F 1/006; H03K 2217/960775; E03C 1/14; C02F 2209/42
See application file for complete search history.

(56) References Cited

U.S. PATENT DOCUMENTS 4,173,893 A * 11/1979 Hedrick ................ G01F 23/266
                                                          340/620
5,636,762 A     6/1997 Juhola et al.
(Continued)

FOREIGN PATENT DOCUMENTS

| EP | 0753438 A1 | 1/1997 |
|---|---|---|
| WO | 2007002119 A1 | 1/2007 |
| WO | 2015019335 A1 | 2/2015 |

OTHER PUBLICATIONS

International Patent Application No. PCT/IB2014/063855, Search Report and Written Opinion dated Jan. 8, 2015.
(Continued)

*Primary Examiner* — J. Casimer Jacyna
(74) *Attorney, Agent, or Firm* — Kilpatrick Townsend & Stockton LLP; Dean W. Russell; Kristin M. Crall

(57) ABSTRACT

Embodiments of the present disclosure generally provide a grey water interface valve liquid level sensor system. The liquid level sensor system may deliver information about the water level and the water movement that occurs in a water reservoir. A control unit may then activate a valve to open so that the water can be removed via vacuum.

9 Claims, 8 Drawing Sheets

(51) Int. Cl.
*G01F 23/26* (2006.01)
*G01F 25/00* (2006.01)
*E03B 1/04* (2006.01)
*E03C 1/14* (2006.01)
*E03F 1/00* (2006.01)

(52) U.S. Cl.
CPC .......... *G01F 23/265* (2013.01); *G01F 23/266* (2013.01); *G01F 23/268* (2013.01); *G01F 25/0061* (2013.01); *C02F 2209/42* (2013.01); *E03B 2001/045* (2013.01); *E03C 1/14* (2013.01); *E03F 1/006* (2013.01); *H03K 2217/960775* (2013.01)

(56) References Cited

U.S. PATENT DOCUMENTS

| | | | |
|---|---|---|---|
| 7,118,677 B2 | 10/2006 | Hoffjann et al. | |
| 7,509,856 B1* | 3/2009 | Winkens | G01F 23/265 73/304 C |
| 2005/0280424 A1 | 12/2005 | Qu et al. | |
| 2013/0205893 A1* | 8/2013 | Shearer | G01F 23/268 73/290 R |
| 2013/0305444 A1* | 11/2013 | Boodaghians | E03D 5/003 4/323 |
| 2016/0047683 A1* | 2/2016 | Winkens | G01F 23/266 73/304 C |

OTHER PUBLICATIONS

International Preliminary Report on Patentability in International Application No. PCT/IB2014/063855 dated Feb. 18, 2016, 7 pages.

* cited by examiner

GREY WATER INTERFACE VALVE LIQUID LEVEL SENSOR SYSTEM

CROSS REFERENCE TO RELATED APPLICATIONS

This application claims the benefit of U.S. Provisional Application Ser. No. 61/864,143 filed Aug. 9, 2013, titled "Grey Water Interface Valve Level Sensor," the entire contents of which are hereby incorporated by reference.

FIELD OF THE DISCLOSURE

Embodiments of the present disclosure relate generally to a grey water interface valve liquid level sensor system. The liquid level sensor system may deliver information about the water level and the water movement that occurs in a water reservoir. A control unit may then activate a valve to open so that the water can be removed from the reservoir via vacuum.

BACKGROUND

A grey water interface valve (GWIV) system may be installed below a sink in a lavatory or galley of a passenger transport vehicle, such as an aircraft. The GWIV system may be provided in connection with a reservoir that serves as a holding tank for grey water or other liquids leaving the sink. The main components of a GWIV system include a wash basin/sink, a reservoir, a control unit, and a valve. Grey water (which can include spent water from hand-washing, detergents, unconsumed liquid beverages, or any other combination of liquids or semi-solid material) may leave the wash basin drain and flow into the reservoir. The reservoir may be in fluid communication with a vacuum line of the vehicle (or other location for the intended re-use of the grey water, if applicable). When the reservoir is full, most (but not all) of the water should be evacuated out of the reservoir. A small amount of water is generally allowed to remain in the reservoir in order to maintain a noise buffer between the vacuum line and the wash basin.

The control unit of this system may have one or more sensors that detect when the reservoir is full or should otherwise be emptied. However, improvements to sensors for detecting liquid movement through the GWIV system are desired.

DETAILED DESCRIPTION

Embodiments of the present disclosure provide a liquid level sensing system 30. The system 30 disclosed may be used in connection with a grey water interface valve system 10. The system 30 disclosed may be used in connection with any another other system that is designed to sense liquid levels and to move liquid from one location to another. For example, the system 30 described may be used in connection with a vacuum toilet system, a potable water tank, a waste tank, any liquid holding/movement reservoir, or any other type of reservoir system, or any other use. Although the system 30 is described in connection with a GWIV system 10 for use on an aircraft for perspective and ease of reference, it should be understood that it is not so limited and may be used in any other appropriate application.

Figure 1A:
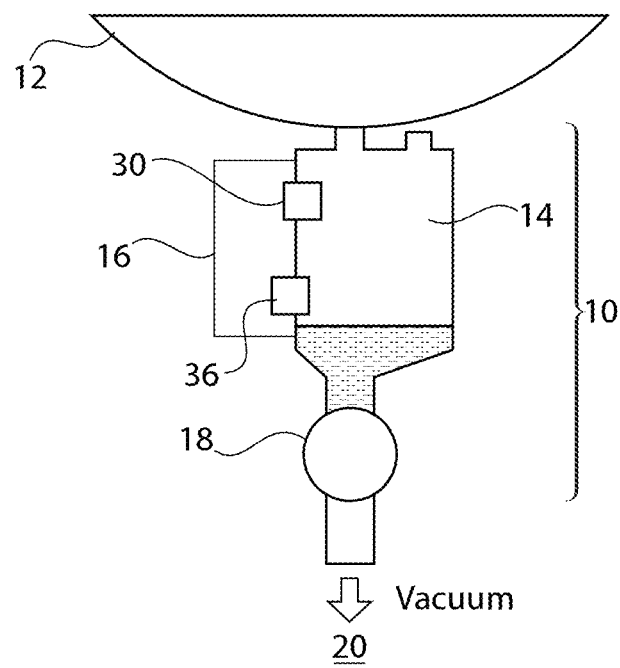
FIG. 1A shows a schematic view of a liquid level sensing system that may be used with a water reservoir, with the reservoir in a near empty configuration.

FIG. 1 illustrates one example of a use for the liquid level sensing systems 30 described herein. As shown, spent liquid from a sink 12 or wash basin is delivered to a reservoir 14. When the control unit 16 detects a full reservoir 14, it can direct the pinch valve 18 (or other type of valve) to open until the reservoir 14 is nearly emptied by vacuum via the vacuum line 20. The reservoir 14 is generally not fully emptied because of the noise that would be produced by air from the vacuum that is pulled through the pinch valve 18. The vacuum level, hence the velocity of the drained liquid level, can be variable.

The control unit 16 is thus provided with a liquid level sensing system 30. The liquid level sensing system 30 is generally designed to instruct the control unit 16 as to when a flush of the reservoir 14 is needed. In one example, the control unit 16 may include one or more sensors. The sensors of the control unit 16 may be non-intrusive. In one example, the sensors of the control unit may be proximity or position sensors, which sense the presence of liquid without actually being in physical contact with the liquid. In one specific example, the sensors of the control unit may be capacitive sensors. The sensors may be designed to detect the full state of the reservoir 14 and to control near emptying of the reservoir 14 with a wide range of liquids.

Figure 13:
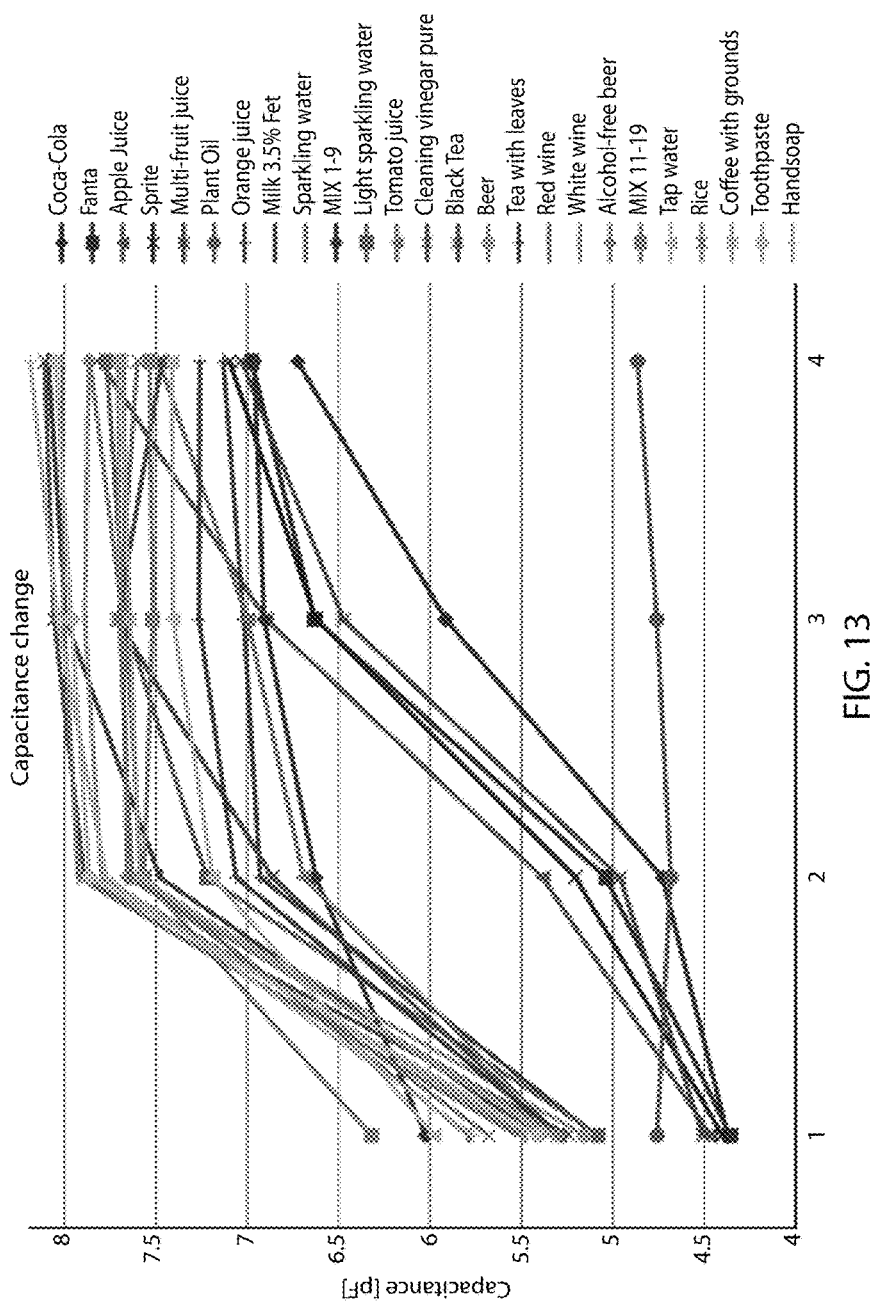
FIG. 13 shows one example of the measured property depending upon the nature of the liquid media as a function of the height of the reservoir.

The system may measure signal output from the sensors. FIG. 13 shows one example of the measured property (e.g., capacitance in picofarad pF) depending upon the nature of the liquid media as a function of the height of the reservoir (e.g., in inches).

The liquid level sensing system 30 may be designed to work with all different types of liquids, as the materials that are poured down a sink can vary. Rather than designing a single sensor that works with a particular type of liquid, the present disclosure provides a liquid level sensing system 30 that works with all types of liquids, including those that vary in color, clarity, temperature, and viscosity/flow rates. The liquid level sensing system 30 may also be designed to address issues that may arise when foam is created at the surface of the liquid, which some sensors may detect as actual fluid, rather than air. The liquid level sensing system 30 may also be designed to address issues that may arise when one or more of the liquids in the system leave a residue on the reservoir, rendering classical level reading more difficult, and which some sensors may detect as the continued presence of liquid. The liquid level sensing system 30 may also be designed to address issues that may arise when the reservoir has rough or uneven walls. The liquid level sensing system 30 may also be designed to address issues that may arise when the liquid is grounded and/or the resistance to ground is variable.

One way to overcome such challenges is to provide a reference point that can be manipulated to prevent sensor confusion. In one example, the sensor system may reference the last vertical position of the liquid, as well reference the last horizontal position of the liquid. This information can be reconciled to indicate the actual and current status of liquid present. This information may also be used to re-calibrate the sensor system if needed. For example, if the system is shut down, if a power failure occurs, or if movement of the liquid occurs when the sensors are not activated, it is desirable to provide a way for the sensor system to re-calibrate itself.

Figure 1B:
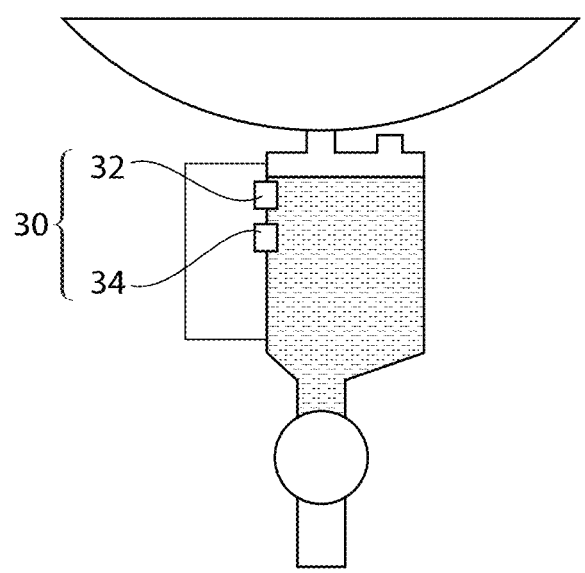
FIG. 1B shows a schematic view of a liquid level sensing system that may be used with a water reservoir, with the reservoir in a near full configuration.

In one specific example, the liquid level sensing system 30 may include two types of sensors: a differential sensor 32 and an absolute sensor 34. One example is shown in FIG. 1B. These types of sensors 32, 34 may be provided in cooperation with one another so that they work collectively work for optimal sensing. The sensors may be capacitive sensors, such that they comprise electrodes or conducting plates that are separated by a non-conducting material, such as a dielectric. The dielectric may be air, ceramic, fuel, the non-conducting material of the reservoir itself, or some other suitable, non-conducting substance or material. The sensors may be used with or without an insulating layer, depending upon the conductivity of the liquid to be measured.

Use of the two types of sensors in combination can provide enhanced readings. For example, a differential sensor 32 detects the surface of a liquid as liquid is passing by the sensor. When the liquid is not moving, the differential sensor does not reflect a reading. A differential sensor does not detect whether the reservoir is full or empty. A differential sensor is generally robust against different grounding situations. A differential sensor is not as easily "fooled" by a layer, film or residue of material at or near the sensing surface as an absolute sensor may be.

An absolute sensor 34 detects the presence of liquid and can indicate whether the reservoir is full or empty. An absolute sensor will reflect high readings when liquid is in front of the sensor plate. Using an absolute sensor alone may give false readings, due to the presence of a film or other layer of material that may build up on the reservoir wall. An absolute sensor may detect this as the continued presence of a liquid in front of the sensor (a "full" state), even in instances when the reservoir is empty. Use of a differential sensor alone may give false readings if the reservoir is filled or emptied during a power out or power down situation. Accordingly, the combination of the sensors together can help provide accurate readings by calibrating information from both sensors together.

Figure 2:
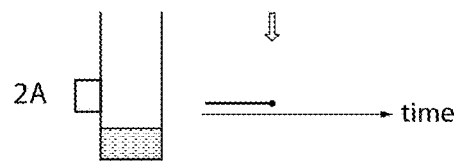
FIGS. 2A-C show readings reflected from movement of liquid past a differential sensor upon filling of a reservoir.
Figure 2:
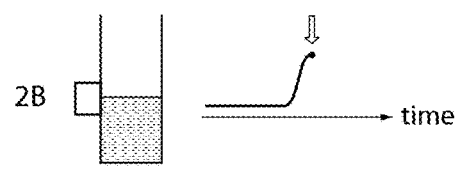
Figure 2:
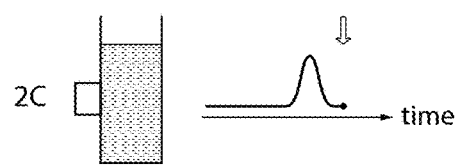

Referring more specifically to how the individual sensors work, a differential sensor 32 may be used to detect the surface of a liquid as liquid is passing by the sensor. A differential sensor does not detect whether the reservoir is full or empty. FIGS. 2A-C show an example of a reading from a differential sensor, based on varying levels of liquid, as the reservoir 14 is being filled. As shown in FIG. 2A, the reservoir is close to empty. Because liquid is not passing the differential sensor 32, the sensor does not register a reading. As shown in FIG. 2B, when liquid is passing the differential sensor 32, the sensor 32 registers a reading that liquid is moving. As shown in FIG. 2C, the reservoir is close to full. Because liquid is no longer passing the differential sensor 32, the sensor 32 does not register a reading. The differential sensor 32 detects that liquid has passed by sensor. The differential sensor also detects the amount of time the liquid is actually passing by the sensor 32.

Figure 3:
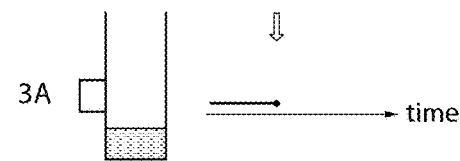
FIGS. 3A-C show readings reflected from movement of liquid past an absolute sensor upon filling of a reservoir.
Figure 3:
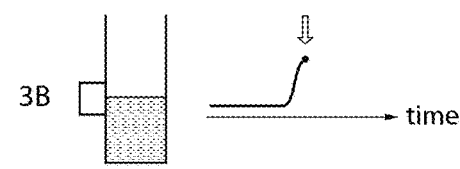
Figure 3:
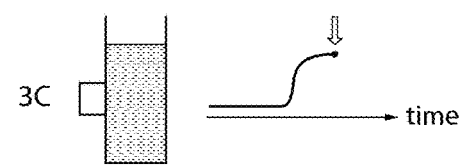

An absolute sensor 34 may be used to detect the presence of liquid in the vicinity of the sensor and can indicate whether the reservoir is full or empty. An absolute sensor will reflect high readings when liquid is present or otherwise in front of the sensor plate. FIGS. 3A-C show an example of a reading from an absolute sensor, based on varying levels of liquid, as the reservoir 14 is being filled. As shown in FIG. 3A, the reservoir is close to empty. Because liquid is not in front of the absolute sensor 34, the sensor does not register a reading. As shown in FIG. 3B, when liquid is passing in front of and remains in front of the absolute sensor 34, the sensor 34 registers a reading that liquid is present. As shown in FIG. 3C, the reservoir is close to full. Because liquid is in front of the absolute sensor 34, the sensor 34 registers continues to register a reading, indicating that liquid remains at the sensor level. The absolute sensor 34 thus detects the presence of liquid at the level where the sensor is placed on the reservoir housing.

Figure 4:
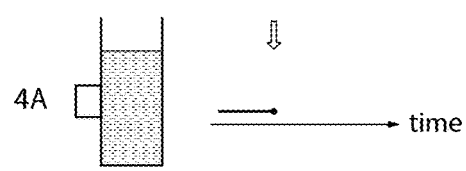
FIGS. 4A-C show readings reflected from movement of liquid past a differential sensor upon emptying of a reservoir.
Figure 4:
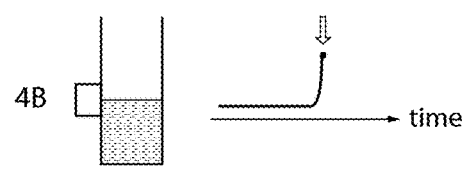
Figure 4:
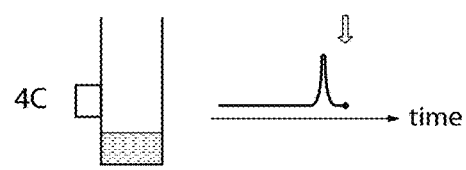

Readings from the two types of sensors 32, 34 are shown during draining of the reservoir 14 in FIGS. 4A-C and 5A-C. FIGS. 4A-C show an example of a reading from a differential sensor, based on varying levels of liquid, as the reservoir 14 is being emptied or drained via vacuum. As shown in FIG. 4A, the reservoir is close to full. Because liquid is not passing the sensor 32, the sensor does not register a reading. As shown in FIG. 4B, liquid passes the sensor 32 as vacuum is applied. The sensor 32 registers a reading that liquid is moving past it. As shown in FIG. 4C, the reservoir is close to empty. Because liquid is no longer passing the sensor 32, the sensor 32 does not register a reading. During draining of the reservoir, the peak (or the jump) of the reading is shorter (in duration) because the liquid is removed quickly via vacuum. The surface of the liquid passes by the sensor 32 with a higher velocity than during filling.

Figure 5:
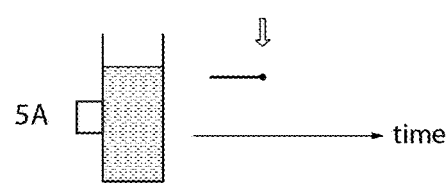
FIGS. 5A-C show readings reflected from movement of liquid past an absolute sensor upon emptying of a reservoir.
Figure 5:
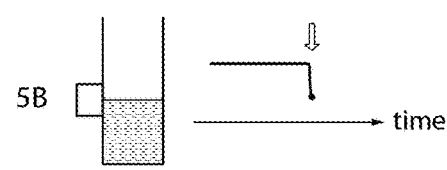
Figure 5:
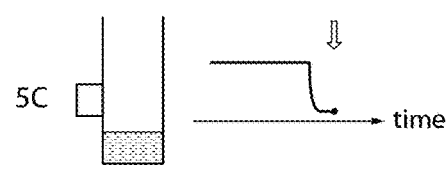

FIGS. 5A-C show an example of a reading from an absolute sensor, based on varying levels of liquid, as the reservoir 14 is being emptied or drained via vacuum. As shown in FIG. 5A, the reservoir is close to full. Because liquid is in front of the sensor 34, the sensor registers a reading. As shown in FIG. 5B, when liquid is passing in front of and remains in front of the sensor 34, the sensor 34 registers a reading that liquid is present. But as the liquid drains, the reading lowers. As shown in FIG. 5C, the reservoir is close to empty. Because liquid is no longer in front of the sensor 34, the sensor 34 registers a reading indicating that there is no liquid at the sensor level. As discussed above, during draining of the reservoir, the decrease (or lowering) of the reading is shorter (in duration)

because the liquid is removed quickly via vacuum. The surface of the liquid leaves the sensor face with a higher velocity than during filling.

A differential sensor may be used as point level sensor. It reads high values when the surface of the liquid is at the position of the sensor plates; otherwise the values are low. This is shown in FIGS. 2A-C and FIGS. 4A-C. However if the system powers down or otherwise empties or fills when the differential sensor 34 is not active, a back-up status reading for the reservoir would be needed. The absolute measuring sensor 34 may be used for this purpose. For example, the absolute sensor may be used in order to provide a current status condition, which would reflect whether the reservoir was filled or emptied during a power off situation. The absolute sensor registers a value when there is liquid in front of the sensor plate; otherwise the values are low. This is shown in FIGS. 3A-C and 5A-C.

In one example, the two sensors 32, 34 may be used in concert with one another. A calibration system 36 may be provided (either in the control unit 16, at another location on the system 10, or at a location remote from the system 10) that can combine reading information from both sensors in order to determine the liquid level condition of the reservoir. The calibration system 36 may be designed to receive input from both a differential sensor 32 and an absolute sensor 34 and to run an algorithm that detects whether the reservoir 14 should be emptied. In one example, the level sensor control unit 16 can have a microprocessor incorporated therein. The microprocessor may interface with the capacitive level sensors. This can provide health monitoring and fault recording, as well as the capability for field loadable software upgrades.

Figure 6:
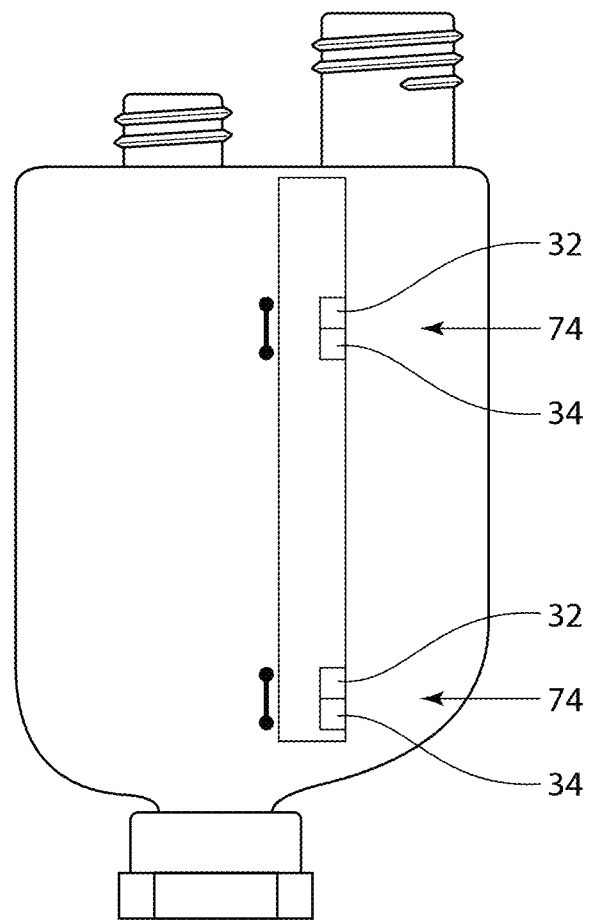
FIG. 6 shows a side perspective view of a reservoir with a sensor system at an outer upper portion of the reservoir and a sensor system at an outer lower portion of the reservoir.

In one embodiment, there may be more than two sensors 32, 34 used. For example, there may be two or more sensors 32, 34 at or near the top or upper portion of the reservoir. There may be two or more sensors at or near the lower portion of the reservoir. At least one of the sensors can provide an absolute reading and at least another of the sensors can provide a differential reading. FIG. 6 shows a reservoir 14 with a sensor system 30 (32, 34) at an outer upper portion 74 of the reservoir and a sensor system 30 (32, 34) at an outer lower portion 76 of the reservoir. This figure shows that the sensors may detect liquid as it flows into the reservoir for a first set of readings and may detect liquid as it flows out of the reservoir for a second set of readings. As discussed, it is also possible to include a family of sensor plates that extend the substantial height of the reservoir.

Figure 7:
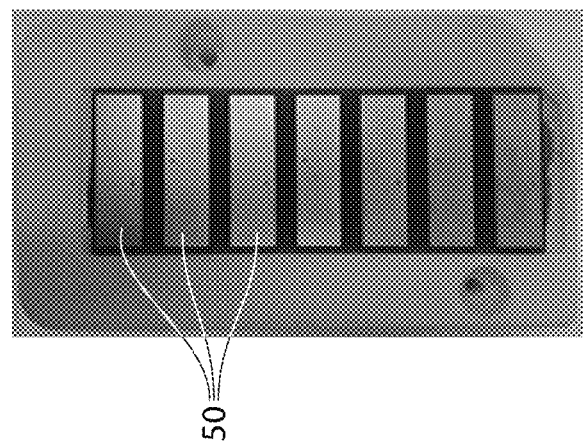
FIG. 7 shows one embodiment of a family of sensor plates that may be positioned along a reservoir.

For example, as shown in FIG. 7, any number of sensors or plates may be used. In one example, the entire side of the reservoir may have a strip of sensors. In another example, the sensors may be strategically placed along the reservoir.

One challenge with using a capacitive sensor or a sensor that is non-intrusive and does not actually contact the liquid to be sensed is that the sensors typically work in a very small and condensed range, so their signals may need to be amplified. The system 30 may include one or more amplifiers or other electronics that can help amplify the signals in order for the readings to be fully accurate. For example, the system may include a printed circuit board (PCB) that can be manipulated for amplification. This may assist the system with differentiating between high and low levels of liquid.

Another challenge that may be experienced when measuring liquid levels is that when the liquid gets a connection to an electrical ground, the readings can be skewed. A connection to an electrical ground might occur during hand washing, when water is drained and the liquid gets connected to a metallic and grounded part of a tube, or in use with a grounded metal sink, or any other instance. In one embodiment, it has been found that the grounding problem may be solved by using an excitation frequency greater than about 4 MHz. In another example, an excitation frequency greater than about 5 MHz may be used. In another example, an excitation frequency between about 4 MHz to about 20 MHz may be used. It should be understood that this frequency may be optimized based on other frequencies used on-board the aircraft. This frequency may be optimized based on the wall geometry of the reservoir. This frequency may be optimized based on the anticipated fluids to be measured. This frequency may be optimized based on any combination to increase the dielectric constant of the sensor. It may be optimal to identify a frequency that does not interfere with the sensor readings, but also a frequency at which the sensors do not interfere with other aircraft equipment. The frequency may be optimized for the environment, and it may be found that other frequencies are optimal for different circumstances.

Use of a high excitation frequency can also help solve a problem with foam produced by hand soap. Foam produced by hand soap can be detected as air by the sensing system when the excitation frequency is high enough. This means soap on the top of water will not trigger a sensor. A high excitation frequency can also help prevent residues on the wall in front of the sensor plates from being read as liquid.

Figure 8:
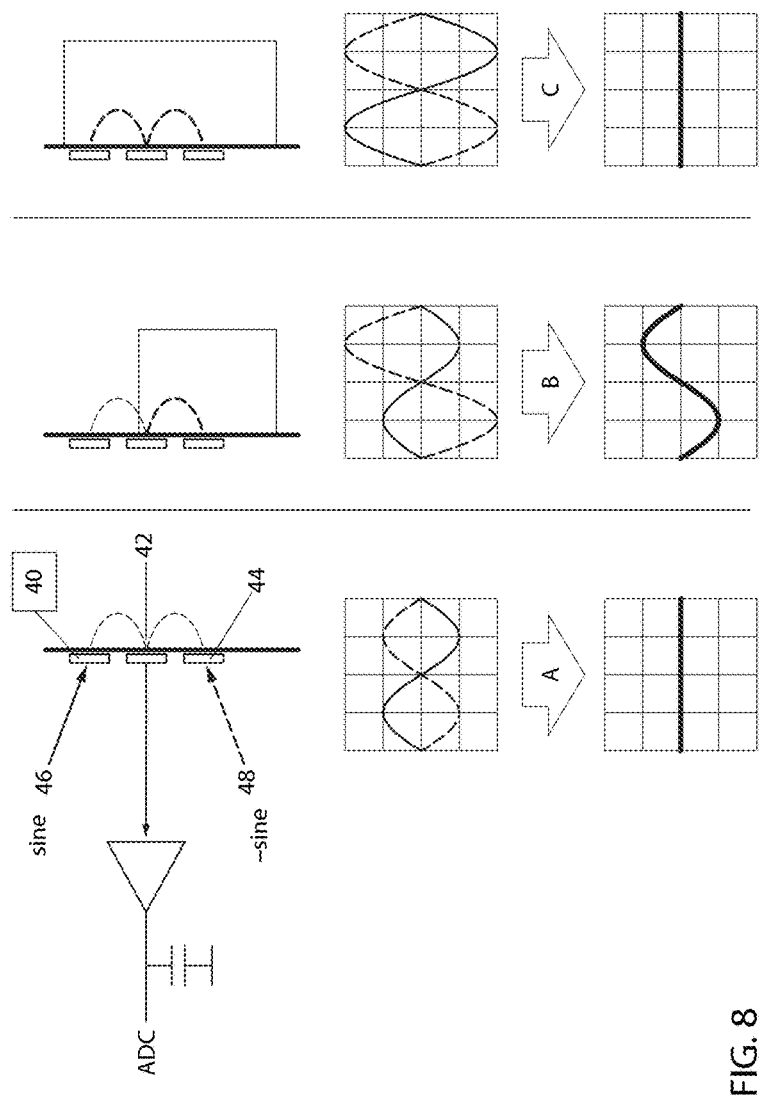
FIG. 8 shows one configuration of a differential sensor system and various readings therefrom.

FIG. 8 shows one example of readings that can occur with a particular differential sensor configuration 38. In this configuration 38, three horizontal plates 40, 42, 44 are provided. The upper plate 40 is fed with a sine signal 46 and the lower plate 44 is fed with the inverted signal 48. This means both signals sum up to zero. The middle plate 42 is used for measuring. If the lower 40 and upper 44 plates have the same capacitive coupling to the middle plate 42, then the readings are zero. This is shown by Arrows A and C. If the couplings are different, then the readings are greater than zero. This is shown by arrow B. A pulse has been detected. The bigger the difference, the higher the readings.

Sine waves may be used to reduce emissions. For example, sine waves do not produce harmonic frequencies and are less likely to be offensive to the environment and other electronics in the vicinity. The signal can be attenuated to be non-radiating and non-susceptible to radiation.

Although an embodiment with three differential sensor plates is shown, it should be understood that any number of plates may be used. In one example, it is useful to use plates in a multiple of three. However, it is also possible to switch plates so that a single plate can reflect multiple types of readings. This may be accomplished via sensor plate switching. Sensor plate switching may allow one plate to function as an excitation plate (that is fed with signals) during one reading, and to allow that same plate to function as a read plate during a different reading. This may occur to increase sensitivity of the plates and/or to increase the accuracy of the readings obtained.

Figure 9:
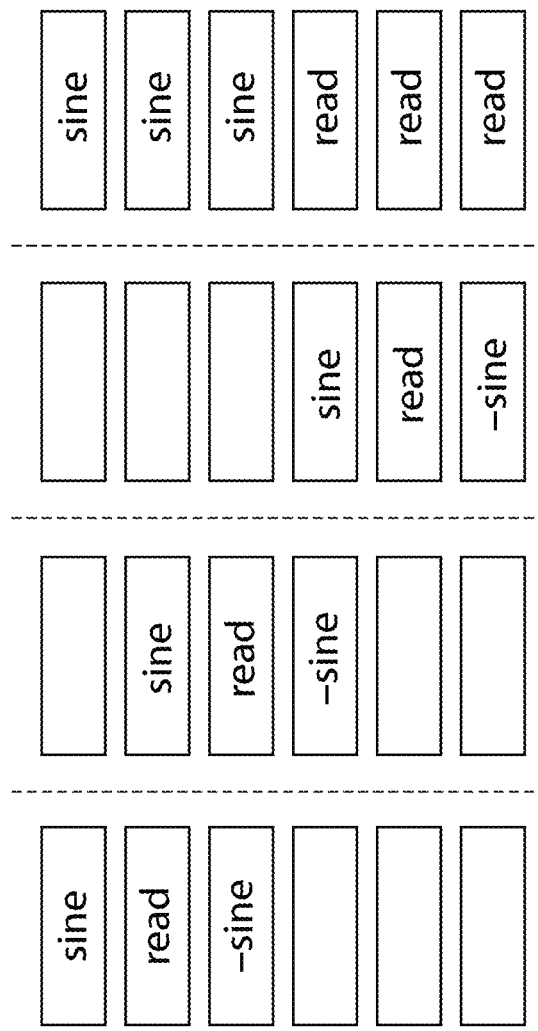
FIG. 9 shows various combinations that may be used with sensor plate switching for various inputs and reading functions.

For instance, the small reservoir of the GWIV system 10 does not give much space for sensor plates. Because it is typically the case that the larger the plates, the better the readings, it may be desirable to use a family of plates. One embodiment may include a number of plates 50 arranged horizontally along one side of the reservoir 14. One example of this configuration is shown in FIG. 7. With switches, these plates 50 can be used as absolute or differential sensors of different sizes or at different positions. This is illustrated by FIG. 9. FIG. 9 shows that a plate may be used as either an excitation plate or as a reading plate. In one example, analog switches that have a feedthrough when they are open may be used. In another embodiment, some plates 50 may be arranged vertically and some plates may be arranged horizontally. If the plates become dirty or otherwise have trouble reading, the control unit can switch to another stack of plates.

Figure 10:
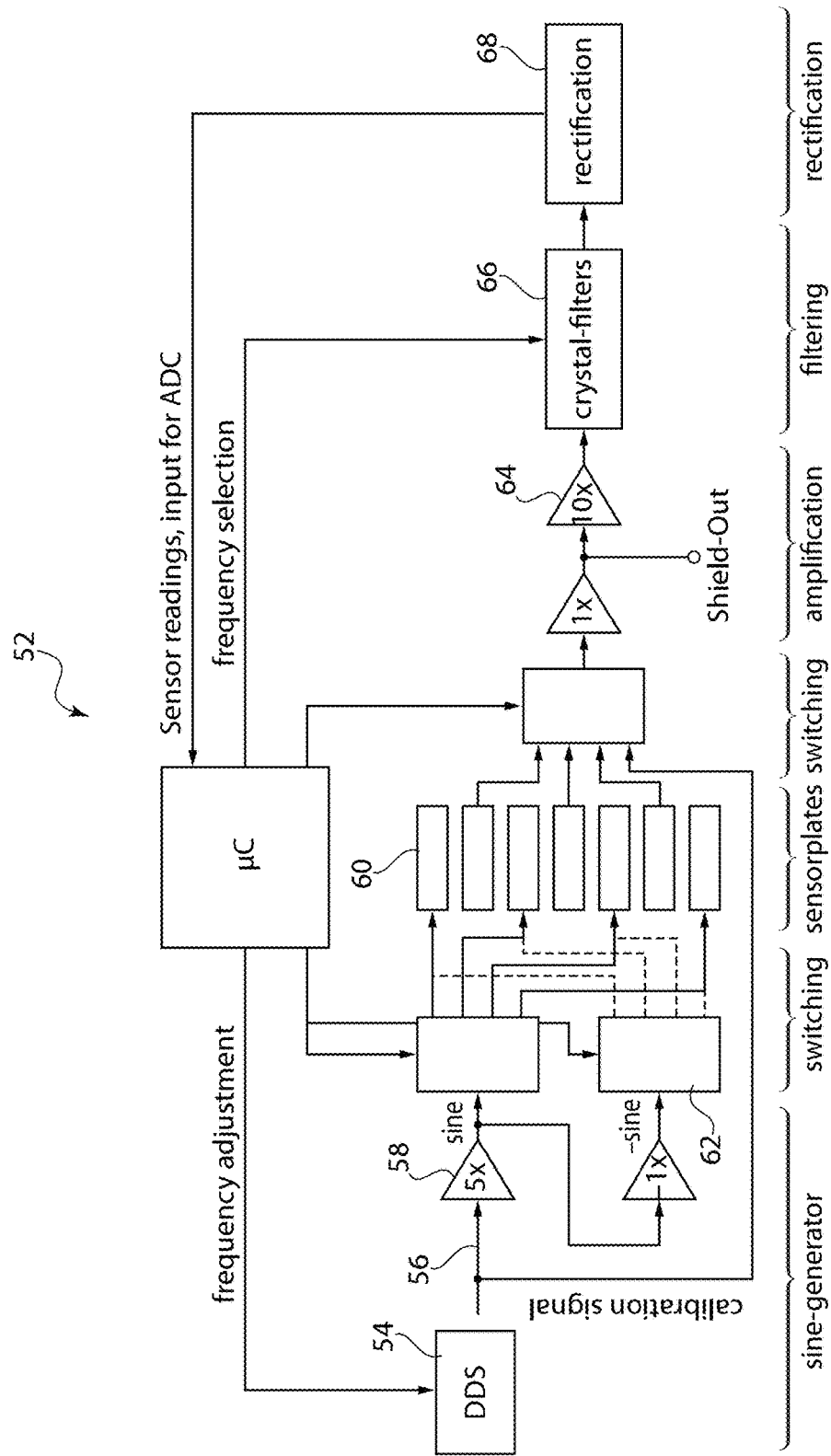
FIG. 10 shows a schematic of a hardware design that may be used for frequency hopping and/or sensor plate switching.

FIG. 10 shows one example of a hardware design 52 that may be used for controlling various plates for various reading inputs. This design 52 can be used to manage a series of sensor plates in order to obtain readings. As shown, the sine signal 56 for excitation may be produced by an integrated circuit (IC) 54 with Direct Digital Synthesis (DDS). The adjustable frequency may be a range from about 0 Hz to about 20 MHz. It may be desirable to pass the signal through an amplifier 58. The signal is then delivered to the sensor plates 60. A signal switching system 62 may be used to direct the signals appropriately. The switching signal system 62 may use analog switches that select which plate should receive the signal. Any given plate could receive a sine or co-sine wave or be a read plate. Once the plates 60 have conducted the reading steps, it may be desirable to pass the signal through another amplifier/amplification step 64. It may also be desirable to pass the signal through a filter system 66 and/or a rectification system 68.

The frequency signal may be disturbed when the sensor(s) read high values and the sine wave generator is turned off. If the sensor excitation frequency is disturbed, it is possible to hop to another frequency. This may be referred to as frequency hopping. The sensors need not use only a single frequency for excitation. If one frequency is not working because of noise, another frequency may be chosen from a set of frequencies. In one example, the sensor design may use two (or more) different frequencies. In a specific embodiment, the frequencies may be 5 MHz and 8 MHz. In one example, the sensor design may use three, four, or five (or more) different frequencies. The frequencies may be dictated by the filter system 66 of the sensor hardware 52. In one embodiment, a crystal filter (which has a small bandwidth) may be used. A calibration switch may be used to analyze the characteristics of each filter (e.g., using a spectrum analyzer) to determine the exact position of the transmitting frequency.

Figure 11:
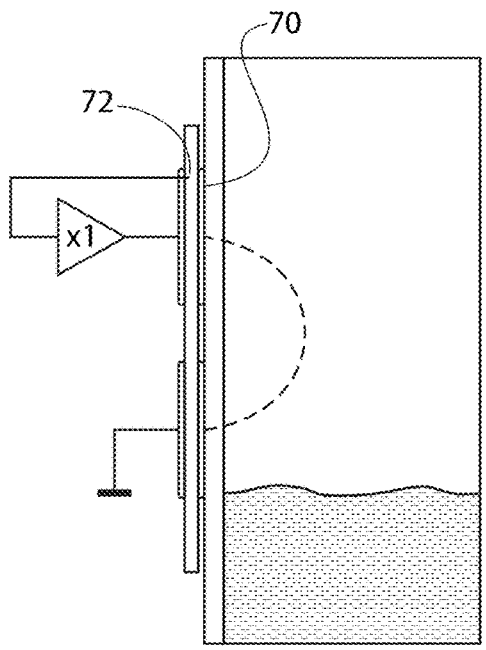
FIG. 11 shows a schematic of a sensor plate that incorporates a shielding feature.

FIG. 11 shows one embodiment in which a sensor/excitation plate 70 uses a shielding feature 72. The shielding feature 72 may be a ground plate on the back side of the sensor/excitation plate 70. In another embodiment, the shielding feature 72 may be an equipotential plate on the back side of the sensor/excitation plate 70. (This can be beneficial because shielding by ground may destroy sensitive readings in some instances.) The capacity from the sensor plate 70 to the equipotential plate may be zero.

Figure 12:
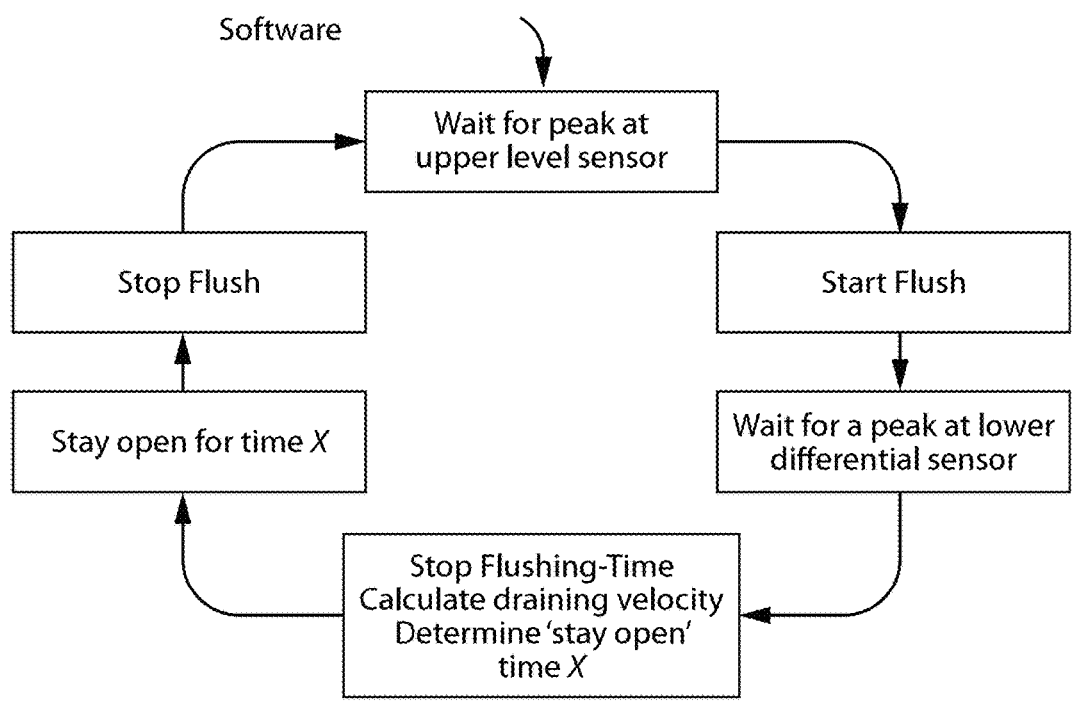
FIG. 12 shows an example of flow for software that can be configured for peak detection based on draining velocity in order to adjust time the time that the valve is open.

FIG. 12 shows an example in which the software can be configured for peak detection based on draining velocity in order to adjust time the time that the valve is open. There may be different draining velocities for the reservoir because the vacuum level may vary over time. There may be different filling velocities because the sink may be clogged so that liquid flows into the reservoir more slowly, the drain may be closed while the sink is filled and them released, causing liquid to enter the reservoir more quickly, and so forth. For this purpose, the system can use the readings of the two different sensors to determine the velocity of the drained liquid level. With the knowledge of the position at some time and the velocity of the liquid level, the system can allow the liquid level to stop at a defined level (with some tolerance) independent to the vacuum level.

In one example, there is provided a water level sensing system that includes at least one differential sensor and at least one absolute sensor; wherein the water level sensing system is positioned on an outer surface of a liquid reservoir such that the system does not contact liquid in the reservoir, and wherein the sensors function at an excitation frequency of greater than about 4 MHz.

In another example, there is provided a grey water interface valve sensor system for use on a passenger vehicle. In a particular use, the vehicle may be an aircraft. The system may include a wash basin, a reservoir, a control unit, a valve, a vehicle vacuum system, and a level sensing unit. The level sensing unit may have at least one differential sensor and at least one absolute sensor positioned on an outer upper portion of the reservoir; and at least one differential sensor and at least one absolute sensor positioned on an outer lower portion of the reservoir, wherein the level sensing system directs the control unit to activate the valve in order to allow the vacuum system to drain the reservoir.

In another example, there may be provided a method of the sensing system for use in draining a reservoir. The method may include sensing a liquid level of a reservoir and draining the reservoir using a control system, a valve, and a vacuum system when the reservoir is full or almost full. It may include the steps of providing at least one differential sensor and at least one absolute sensor at an upper portion of the reservoir; providing at least one differential sensor and at least one absolute sensor at a lower portion of the reservoir; sensing movement of liquid past the differential sensor; indicating to the control system when the reservoir is full based on sensed information; sending control directions to the valve to open for draining of liquid to the vacuum system, and when/if power is shut off, sensing presence of liquid with the absolute sensor for a calibration reading. In this method, the absolute sensor functions as a back-up sensor, since the differential sensor would not detect whether any liquid has passed when the power is shut down.

Changes and modifications, additions and deletions may be made to the structures and methods recited above and shown in the drawings without departing from the scope or spirit of the invention and the following claims.

What is claimed is:

1. A method for sensing a liquid level of a reservoir and draining the reservoir using a control system, a valve, and a vacuum system when the reservoir is full or almost full, comprising:
   providing a liquid level sensing system, comprising:
   at least one differential sensor and at least one absolute sensor, wherein the sensors function at an excitation frequency of greater than about 4 MHz;
   wherein the at least one differential sensor or the at least one absolute sensor comprises a set of at least three sensor plates arranged such that a first plate receives a sine signal, a second plate receives an inverted signal, and a third plate serves as a read plate;
   wherein the liquid level sensing system is positioned on an outer surface of a liquid reservoir such that the system does not contact liquid in the reservoir;
   sensing movement of liquid past the differential sensor;
   indicating to the control system when the reservoir is full based on sensed information;
   sending control directions to the valve to open for draining of liquid to the vacuum system, and
   when power is shut off, sensing presence of liquid with the absolute sensor for a calibration reading.

2. The method of claim 1, wherein the at least one differential measuring sensor and the at least one absolute measuring sensor comprise capacitive sensors.

3. The method of claim 1, wherein the sensors function at an excitation frequency of between about 4 MHz and about 20 MHz.

4. The method of claim 1, wherein the sensors function at a plurality of frequencies and are designed to frequency hop when needed.

5. The method of claim 1, wherein the water level sensing system is installed on a grey water reservoir on an aircraft.

6. The method of claim 1, wherein the level sensing system directs the control system to open the valve if the reservoir is almost full and to close the valve before the reservoir is fully drained.

7. The method of claim 1, wherein the third plate is positioned between the first and second plates.

8. The method of claim 1, wherein the at least three sensor plates are switchable between providing absolute and differential readings.

9. The method of claim 1, wherein the at least three sensor plates are switchable between functioning as sine signal receiver, inverted signal receiver, or read plate.

* * * * *